(12) United States Patent
Chua-Eoan et al.

(10) Patent No.: US 8,760,217 B2
(45) Date of Patent: Jun. 24, 2014

(54) SEMICONDUCTOR DEVICE HAVING ON-CHIP VOLTAGE REGULATOR

(75) Inventors: Lew G. Chua-Eoan, San Diego, CA (US); Charlie Matar, San Diego, CA (US); Matthew L. Severson, San Diego, CA (US); Xiaohua Kong, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 99 days.

(21) Appl. No.: 13/034,845

(22) Filed: Feb. 25, 2011

(65) Prior Publication Data

US 2012/0218005 A1 Aug. 30, 2012

(51) Int. Cl.
*G11C 5/14* (2006.01)

(52) U.S. Cl.
USPC .......................................... 327/530; 538/158

(58) Field of Classification Search
USPC ........................ 327/158, 540, 541, 530, 538
See application file for complete search history.

(56) References Cited

U.S. PATENT DOCUMENTS

| | | | |
|---|---|---|---|
| 6,924,679 B2 * | 8/2005 | Seno et al. ................... | 327/158 |
| 7,417,482 B2 | 8/2008 | Elgebaly et al. | |
| 7,501,868 B2 * | 3/2009 | Ito ................................ | 327/158 |
| 2002/0112193 A1 | 8/2002 | Altman et al. | |
| 2003/0141899 A1 | 7/2003 | Tzartzanis et al. | |
| 2004/0008071 A1 | 1/2004 | Ko et al. | |
| 2004/0060023 A1 | 3/2004 | Bednar et al. | |
| 2004/0060024 A1 | 3/2004 | Bednar et al. | |
| 2004/0130387 A1 | 7/2004 | Marshall | |
| 2005/0047233 A1 | 3/2005 | Deng | |
| 2005/0218871 A1 | 10/2005 | Kang et al. | |
| 2008/0204125 A1 * | 8/2008 | Lee et al. ...................... | 327/544 |
| 2009/0115258 A1 | 5/2009 | Flynn et al. | |

FOREIGN PATENT DOCUMENTS

| WO | WO 03/090055 A1 | 10/2003 |
|---|---|---|
| WO | 2005124480 A1 | 12/2005 |

OTHER PUBLICATIONS

International Search Report and Written Opinion—PCT/US2012/026828—ISA/EPO—Mar. 5, 2013.

\* cited by examiner

*Primary Examiner* — Quan Tra
(74) *Attorney, Agent, or Firm* — Sam Talpalatsky; Nicholas J. Pauley; Joseph Agusta

(57) ABSTRACT

A semiconductor device having an on-chip voltage regulator to control on-chip voltage regulation and methods for on-chip voltage regulation are disclosed. A semiconductor device includes a circuit positioned between a ground bus and a power bus. A power switch array is positioned between the circuit and one of the ground bus or the power bus to generate a virtual voltage across the circuit. A monitor is positioned between the ground bus and the power bus. The monitor is configured to simulate a critical path of the circuit and to output a voltage adjust signal based on an output of the simulated critical path. A controller is configured to receive the voltage adjust signal and to output a control signal to the power switch array to control the virtual voltage.

48 Claims, 11 Drawing Sheets

Decoder Table of the Delay Comparator

| Inputs | | | Outputs | |
|---|---|---|---|---|
| N0 | N1 | N2 | AVS_up | AVS_down |
| 0 | 0 | 0 | 1 | 0 |
| 1 | 1 | 1 | 0 | 1 |
| All other combinations | | | 0 | 0 |

SEMICONDUCTOR DEVICE HAVING ON-CHIP VOLTAGE REGULATOR

FIELD OF DISCLOSURE

The embodiments disclosed herein relate to a semiconductor circuit having an on-chip voltage regulator to control voltage and current applied to a controlled circuit or device under test.

BACKGROUND

Electronic devices incorporating integrated circuits, such as application specific integrated circuits (ASICs), often employ power saving techniques to reduce power consumption and thereby achieve extended battery life. Small, portable devices such as mobile telephones and personal digital assistants (PDAs), for example, typically incorporate circuitry for implementing inactive modes to limit power consumption by logic circuitry. Inactive modes may include stand-by, low power and sleep modes.

Power dissipation in digital circuits, and more specifically in Complementary Metal Oxide Semiconductor (CMOS) circuits, is approximately proportional to the square of the supply voltage. Therefore, an effective way to achieve low-power performance is to scale down the supply voltage. CMOS circuits on ASICs are capable of operating at significantly reduced power levels. In order to avoid increases in propagation delay, however, the threshold voltage of the CMOS devices also is reduced.

The reduction in threshold voltage generally causes an increase in stand-by current due to changes in the sub-threshold leakage current of Metal Oxide Semiconductor (MOS) devices. The leakage current that flows through an "off" transistor tends to increase exponentially as the threshold voltage of a device is reduced. Therefore, electronic devices such as mobile telephones and PDAs that remain in an inactive mode for an extended period of time can exhibit significant leakage current, and cause undesirable drain on battery power during the inactive mode.

In order to reduce leakage current during stand-by modes, some ASICs include power switches (e.g., headswitches and/or footswitches) that are electrically connected between the logic gates of a CMOS circuit and the power bus VDD or ground bus VSS. A headswitch can be a PMOS transistor positioned between the local power bus routing of an ASIC core or block and the top-level power bus routing. A footswitch can be an NMOS transistor positioned between the local ground bus and the top-level ground bus. Generally, headswitches and footswitches are CMOS or other devices which disconnects power or ground potential to source of circuit under test or circuit being controlled. Power switches may be used herein to refer to either a headswitches or footswitches.

During an inactive mode ("sleep mode"), the power switches (e.g., headswitches and/or footswitches) are turned off to disconnect the logic gates from the power/ground supply and thereby "collapse" the voltage across the connected circuit. Because the headswitch or footswitch has a high threshold voltage, the amount of leakage current drawn from the power supply by the power switches (e.g., headswitches and/or footswitches) is substantially reduced relative to the leakage current that would otherwise flow through the logic gates. During an active or operation mode, the headswitches or footswitches are turned on to connect the power supply or ground, respectively, to the gates. Therefore, during an active mode, the logic gates are powered by substantially the same voltage as if they were directly connected to the power supply and ground.

An example directed to a conventional power switch implementation will now be described. FIG. 1 illustrates a conventional semiconductor device 100. The semiconductor device 100 includes at least one circuit 105 and a controller 110. The controller 110 determines whether footswitches (e.g., NMOS transistors) included in a power switch array or matrix 115 are turned "on" or "off". In particular, the controller 110 is configured to receive an external signal indicating whether the circuit 105 is operating in an active mode, or alternatively whether the circuit 105 can enter or remain in an idle state or sleep mode. Based on the external signal, the controller 110 signals the switches (e.g., footswitches) of the power switch matrix 115 to be "on" or "off" (e.g., by applying a signal to a gate thereof). The power switch matrix 115 is connected between a local ground at the circuit 105 and a ground bus 120 that carries a ground voltage VSS. Also shown in FIG. 1 is a power bus 125 that provides a power voltage VDD to the circuit 105.

FIG. 2 illustrates a conventional headswitch configuration. The semiconductor device 200 includes at least one circuit 205 and a controller 210. The controller 210 determines whether the headswitches (e.g., PMOS transistors) included in a power switch array or matrix 215 are turned "on" or "off". In particular, the controller 210 is configured to receive an external signal indicating whether the circuit 205 is operating in an active mode, or alternatively whether the circuit 205 can enter or remain in an idle state or steep mode. Based on the external signal, the controller 210 signals the headswitches of the power switch matrix 215 to be "on" or "off" (e.g., by applying a signal to a gate thereof). The power switch matrix 215 is connected between a local VDD at the circuit 205 and a power bus 225 that carries a supply voltage VDD. Also shown in FIG. 2 is a ground bus/VSS 220 coupled to circuit(s) 205.

As will be appreciated in view of the description given above with respect to FIGS. 1 and 2, the controller (110, 210) turns the switch matrix (115, 215) on or off based on a mode signal received from an external entity. However, a transition of multiple transistors that can collectively constitute the power switch matrix (115, 215) from a first state (e.g., off) to a second state (e.g., on) can potentially cause a significant inrush current to be induced in the respective semiconductor device (100, 200), which may cause damage or malfunctioning of the controlled circuit(s) (105, 205).

SUMMARY

An embodiment can include a semiconductor device comprising: a circuit positioned between a ground bus and a power bus; a power switch array positioned between the circuit and one of the ground bus or the power bus to generate a virtual voltage across the circuit; a monitor positioned between the ground bus and the power bus, the monitor configured to simulate a critical path of the circuit and to output a voltage adjust signal based on an output of the simulated critical path; and a controller configured to receive the voltage adjust signal and to output a control signal to the power switch array to control the virtual voltage.

Another embodiment can include a method of controlling voltage in a semiconductor device having a circuit positioned between a ground bus and a power bus and a power switch array positioned between the circuit and one of the ground bus or the power bus to generate a virtual voltage across the circuit. The method comprising: establishing a target voltage and a clock frequency of the circuit; simulating a critical path of the circuit; outputting a voltage adjust signal based on an output of the simulated critical path; and adjusting the virtual voltage based on the voltage adjust signal by controlling a setting of the power switch array.

Another embodiment can include a method of controlling voltage in a semiconductor device having a circuit positioned between a ground bus and a power bus and a power switch array positioned between the circuit and one of the ground bus or the power bus to generate a virtual voltage across the circuit. The method comprising: step for establishing a target voltage and a clock frequency of the circuit; step for simulating a critical path of the circuit; step for outputting a voltage adjust signal based on an output of the simulated critical path; and step for adjusting the virtual voltage based on the voltage adjust signal by controlling a setting of the power switch array.

Another embodiment can include a semiconductor device having a circuit positioned between a ground bus and a power bus and a power switch array positioned between the circuit and one of the ground bus or the power bus to generate a virtual voltage across the circuit, comprising: means for establishing a target voltage and a clock frequency of the circuit; means for simulating a critical path of the circuit; means for outputting a voltage adjust signal based on an output of the simulated critical path; and means for adjusting the virtual voltage based on the voltage adjust signal by controlling a setting of the power switch array.

BRIEF DESCRIPTION OF THE DRAWINGS

The accompanying drawings are presented to aid in the description of embodiments of the invention and are provided solely for illustration of the embodiments and not limitation thereof.

FIG. 6C illustrates an I/O table for the decoder.

DETAILED DESCRIPTION

Figure 1:
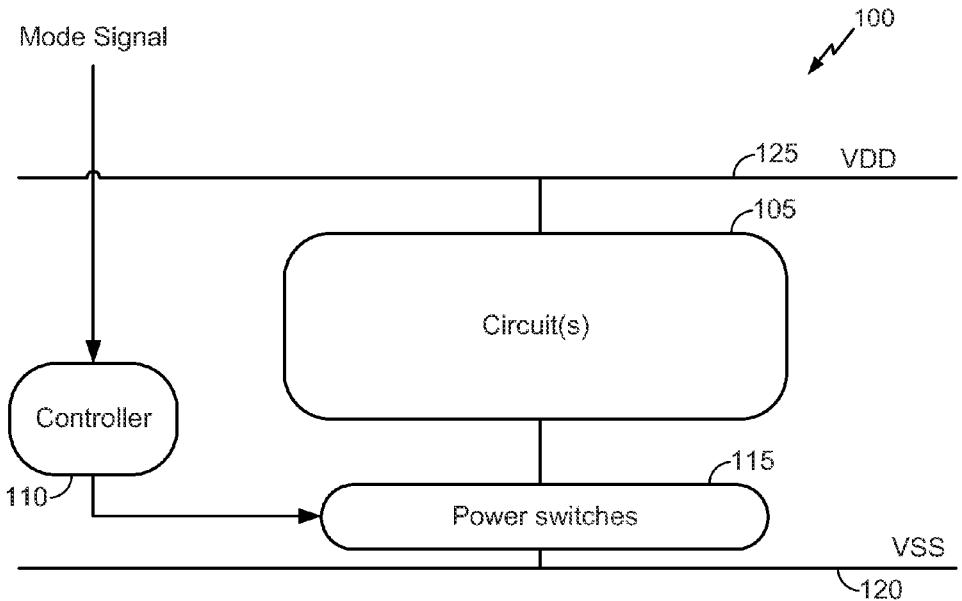
FIG. 1 illustrates a conventional footswitch configuration.
Figure 2:
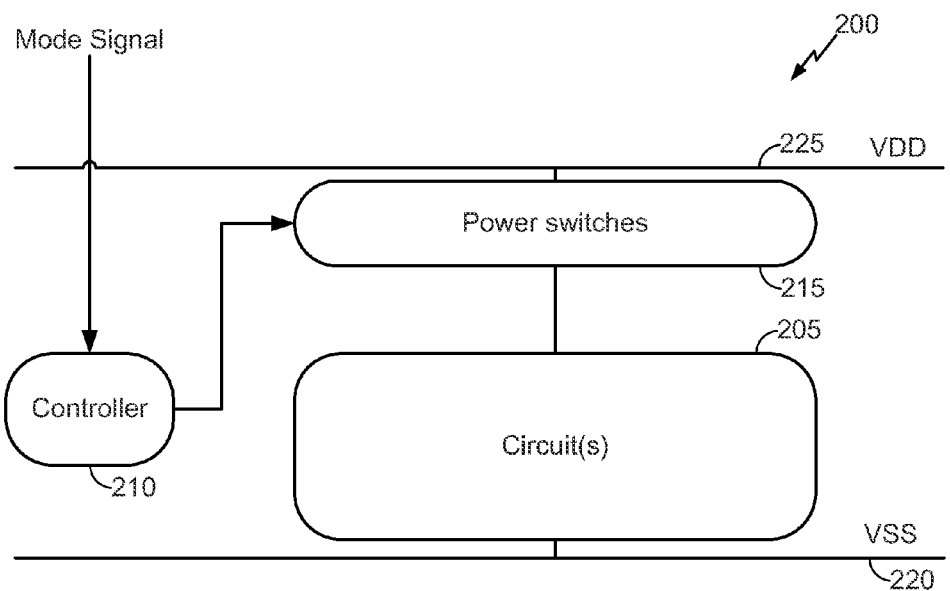
FIG. 2 illustrates a conventional headswitch configuration.

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and the are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored there in a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

In the disclosed embodiments described herein, power switches, included within a power switch matrix, are positioned between one or more circuits including complex circuits such as processor cores (which can generally be considered to be a device under test (DUT)) and power sources (e.g., VDD or VSS) supplying the one or more circuits of a semiconductor device. The voltage drop across the power switches creates a virtual voltage reference (virtual VSS or Virtual VDD) which controls the voltage across the one or more circuits.

Figure 3A:
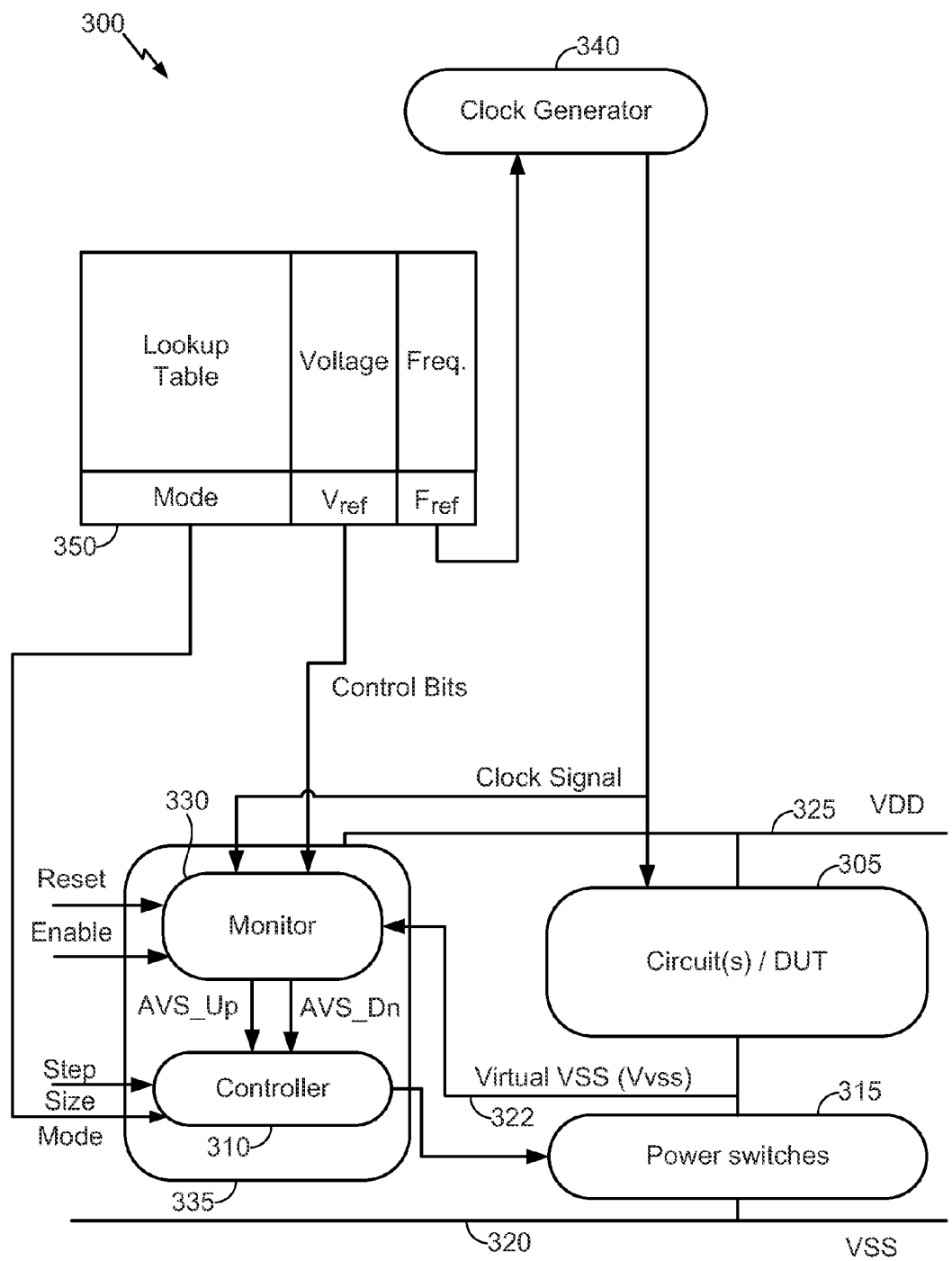
FIG. 3A illustrates a semiconductor device with a footswitch controlled virtual VSS.

FIG. 3A illustrates a semiconductor device 300 according to an embodiment of the present invention. The semiconductor device 300 includes at least one circuit /DUT 305 and a controller 310. The controller 310 controls whether power switches (e.g., footswitches, which may be embodied as NMOS transistors) included in a power switch array 315 are turned "on" or "off". The controller 310 is included within a control unit 335 that further includes a monitor 330. It will be appreciated that these arrangements are not meant to limit the various embodiments and the embodiments encompass any configuration that can achieve the functionality disclosed. For example the various functions described as being performed by the controller 310 may be performed by the monitor 330 or any other element that may perform the described functionality either in whole or part. Accordingly, illustrations and associated discussions contained herein are merely used to facilitate an understanding of the various aspects and embodiments.

The monitor 330 can be configured to receive external signals (e.g., control bits, enable, reset, etc.) to indicate the various operating parameters of the semiconductor device.

Additional details of the mode circuit are illustrated in relation to FIGS. 4A and 4B. Additionally a mode indicator can be input to the controller 310 indicating a mode of the circuit /DUT 305 (e.g., whether the circuit /DUT 305 is to operate in an active mode, one or more intermediate modes, or sleep mode). The monitor 330 is further configured to measure a voltage across the circuit /DUT 305 via VDD and a virtual reference Vvss 322, in other words, the monitor 330 can be configured to measure the voltage across supply bus (VDD) 325 and Vvss 322. The monitor 330 outputs, to the controller 310, one or more control signals (e.g., AVS_Up, AVS_Dn) from a monitor 330 based on the received control bits and feedback from the measured voltage across the circuit /DUT 305. In an example, the feedback can indicate to the controller 310 that the voltage across the circuit /DUT 305 is leading (e.g., too high), lagging (e.g., too low). Based on the feedback, the monitor can adjust Vvss by control signals (e.g., AVS_Up, AVS_Dn) to the controller 310.

The controller 310 in turn can signal the power switch array 315, to turn "on" or "off" individual power switches based on the control signals (e.g., AVS_Up, AVS_Dn) from the monitor circuit, a mode signal and a step size signal. The power switch array 315 is coupled between a Vvss 322 at circuit /DUT 305 and a ground bus 320 that carries a ground voltage VSS in the illustrated footswitch-implementation. The step size input can set the incremental adjustment size that corresponds to each up/down command. The mode signal can set a variety of circuit state modes such as, sleep, on or more intermediate modes and fully awake. For example, the mode signal is set to a sleep state, the power switches (e.g., NMOS transistors) in power switch array 315 will be all set to an off position. If the mode signal is set to fully awake then the power switches in power switch array 315 will be all set to an on position. If the mode signal is set to an intermediate state, then the power switches will be initially set to an appropriate initial state for that setting. The switches may be adjusted from the initial state based on the control signal from the monitor 330 which regulates the actual voltage across the circuit /DUT 305 via feedback of Vvss.

The command signals (e.g., mode, control bits and a reference frequency for the clock) may be provided from a command unit 350. In one embodiment, the command unit 350 can be based on a lookup table that has characteristics of the circuit(s) /DUT 305 being controlled. The command unit 350 can provide the various circuit parameters and settings to control unit 335 directly or indirectly (e.g., frequency via clock generator 340). The clock generator 340 generates a clock frequency based on the settings from the command unit 350 for the various operating points defined in the lookup table.

Following are some example lookup table values for command unit 350 that illustrate various command and operation combinations. For example, the lookup table can be generated for various parameters of circuit(s)/device under test (DUT) 305 corresponding to the various modes of operation. Further, during transitions from one mode to the other, the mode signal can be used to indicate a next level for transition. The control unit 335 action for various transitions is discussed below.

TABLE 1

| Mode Signal | Mode Description | Control Bits | Frequency Setting |
| --- | --- | --- | --- |
| Sleep | Power Switches Off | Default State (e.g. undefined set of bits settings for delay element)/N/A | Clock Gated Off |

TABLE 1-continued

| Mode Signal | Mode Description | Control Bits | Frequency Setting |
| --- | --- | --- | --- |
| Intermediate Mode A | Intermediate Performance Mode A | Static Logic, Dynamic Logic and Wire Parameters for Mode A | Intermediate Freq. A |
| Intermediate Mode B | Intermediate Performance Mode B | Static Logic, Dynamic Logic and Wire Parameters for Mode B | Intermediate Freq. B |
| Fully Awake | Power Switches on | Default State (e.g. no delay elements set)/N/A | DUT Max Frequency |

In sleep state, there all power switches would be set to an off state to remove power from the circuit /DUT under test. In contrast in the fully awake state all power switches would be on. In either the sleep or fully awake state, the control bits may be set to a pre-defined default state (e.g., no delay elements set) or any random state (e.g., the "N/A" as indicated above), since there is no actual control necessary as the power switches are either all on or all off.

For increasing transitions (e.g., from sleep mode to fully awake mode), the controller 310 can adjust the power switch setting based on mode, control bits and voltage potential feedback (e.g. Vvss) to monitor 330. In general, as the modes transition the voltage is established and afterward the frequency is set (via a signal to clock generator 340). For example, the frequency setting may be delayed using a timed counter or an acknowledge signal (not illustrated) from control unit 335. In contrast, when the mode transitions are decreasing (e.g., from fully awake mode or an intermediate mode to sleep mode), the frequency may be reduced prior to entering sleep mode.

Figure 3B:
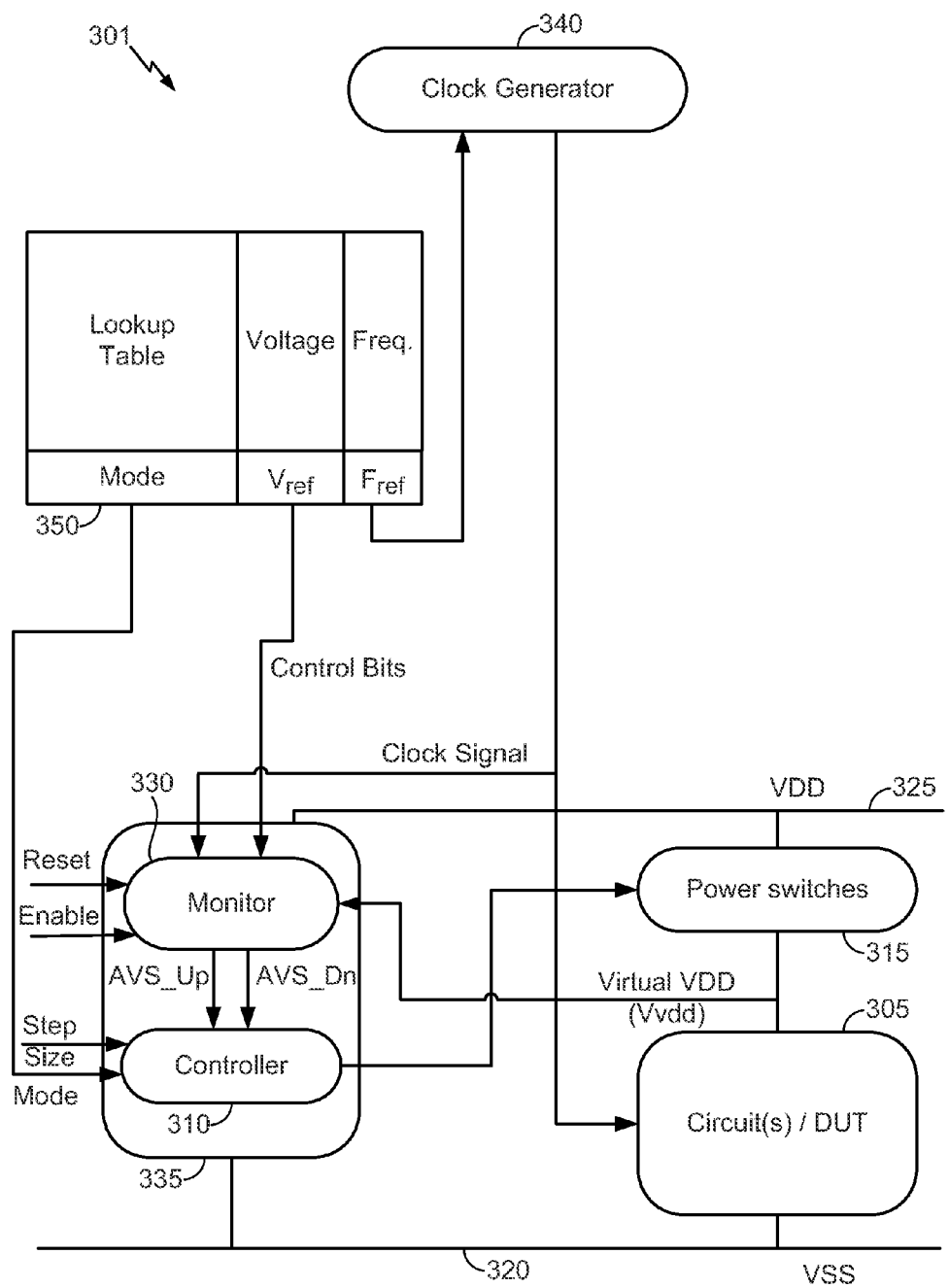
FIG. 3B illustrates a semiconductor device with a headswitch controlled virtual VDD.

FIG. 3B illustrates an arrangement in a headswitch configuration 301. In this configuration the power switch array 315 is positioned between supply bus 325 having voltage VDD and circuit(s) /DUT 305. Accordingly, a virtual VDD (Vvdd) is formed that controls the voltage across the circuit(s)/DUT 305. Monitor 330 receives feedback from the virtual VDD and can regulate the voltage between virtual VDD and VSS. The clock level shifter will also be scaled by virtual VDD and VSS to match the clock signal to the controlled voltage. The remaining aspects are similar to the footswitch configuration of FIG. 3A, so further details will be omitted.

Referring to both FIGS. 3A and 3B, in an example, the monitor 330 can be a process-voltage-temperature (PVT) monitor that simulates PVT characteristics of the circuit /DUT 305, such as a voltage across the circuit /DUT 305. The monitor 330 can be used to match the various an internal parameters indicating an estimate of current expected conditions of the DUT 305 and provide control signals to adjust the controller 310. Additional details of the monitor circuit are discussed below in relation to FIG. 4.

Figure 4:
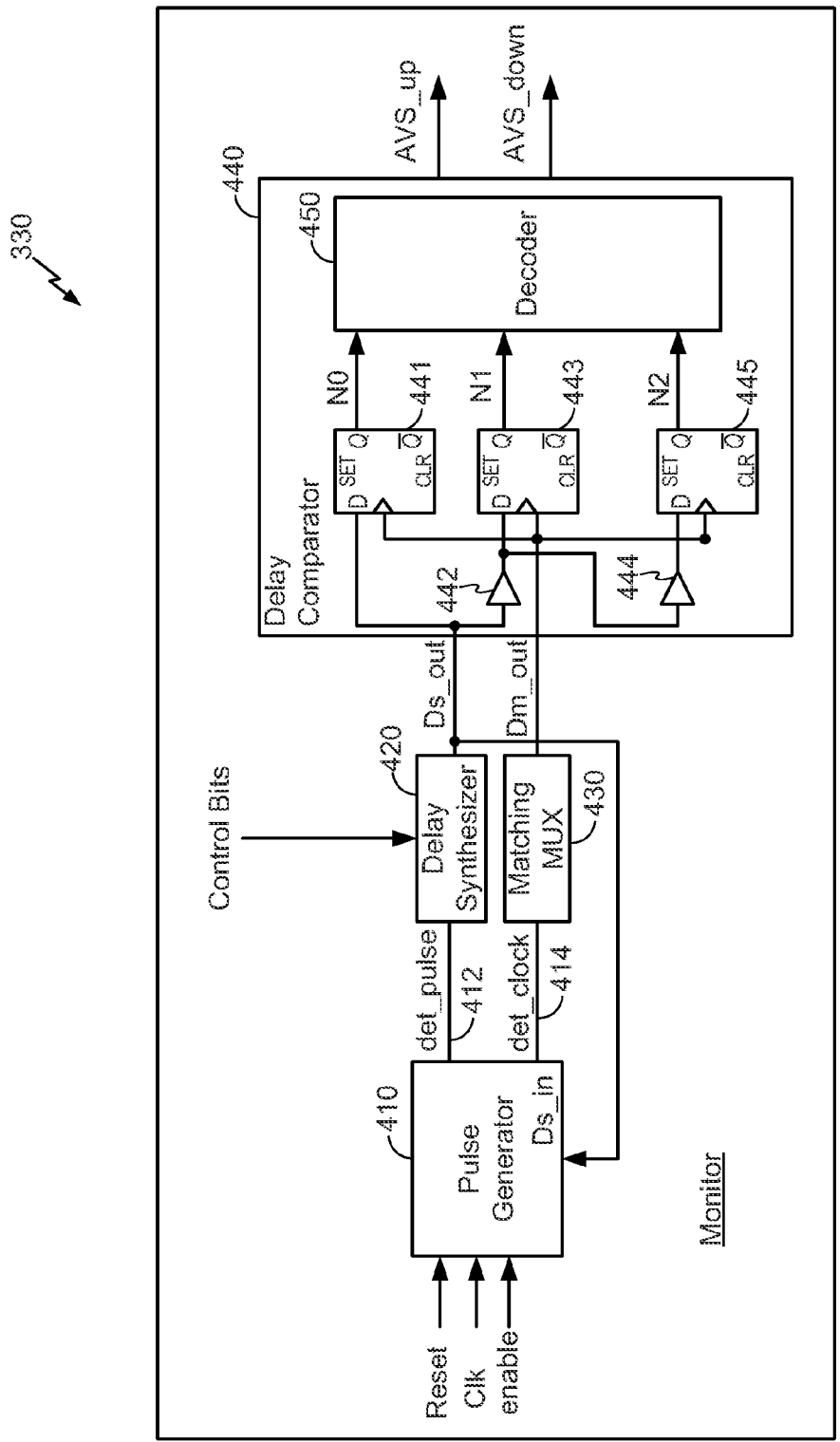
FIG. 4 illustrates details of the monitor of the control unit illustrated in FIGS. 3A and 3B.

FIG. 4 illustrates an embodiment of the monitor 330. Pulse generator 410 generates a detect pulse (det_pulses) and sends it to the delay synthesizer 420. This feedback provides a test artifact to put the monitor in loop back mode (i.e., to act as a ring oscillator so it is possible to measure how many round trips it had in time thereby gauging process speed). The detect pulse is one clock period width based on the clock signal. Further, the pulse generator 410 generates detect clock (det_clock) and sends it to matching MUX circuit 430. Delay synthesizer 420 is a programmable delay chain which mimics the critical path of the DUT 305. Matching MUX 430 compensates for the delay impact of programmable multiplexers in the delay synthesizer 420. Delay comparator 440 generates control signals (e.g., voltage UP/DOWN signals) based on delay difference from delay synthesizer 420 and matching MUX 430. The control signals from delay comparator 440 are provided to controller 310 as to regulate the voltage across the DUT 305.

Delay comparator 440 within monitor 330 compares the delay states and determines whether the current settings for controller 310 should be increased, decreased or left the same. For this embodiment, the Ds_out signal from delay synthesizer 420 is provided to a data (D) input of a D flip-flop 441 and to the input of a buffer 442. The output of 442 couples to the data input of a D flip-flop 443 and to the input of buffer 444. The output of buffer 444 couples to the data input of a D flip-flop 445. The output signal (Dm_out) from matching MUX 430 is provided to the clock inputs of D flip-flops 441, 443 and 445. Each D flip-flop latches its data input based on the out signal and provides it output (Q) to decoder 450. Decoder 450 generates the voltage control signals to controller 310 based on the outputs of flip-flops 441, 443 and 445, which will be discussed in greater detail in relation to FIGS. 6A-6C below.

Figure 5:
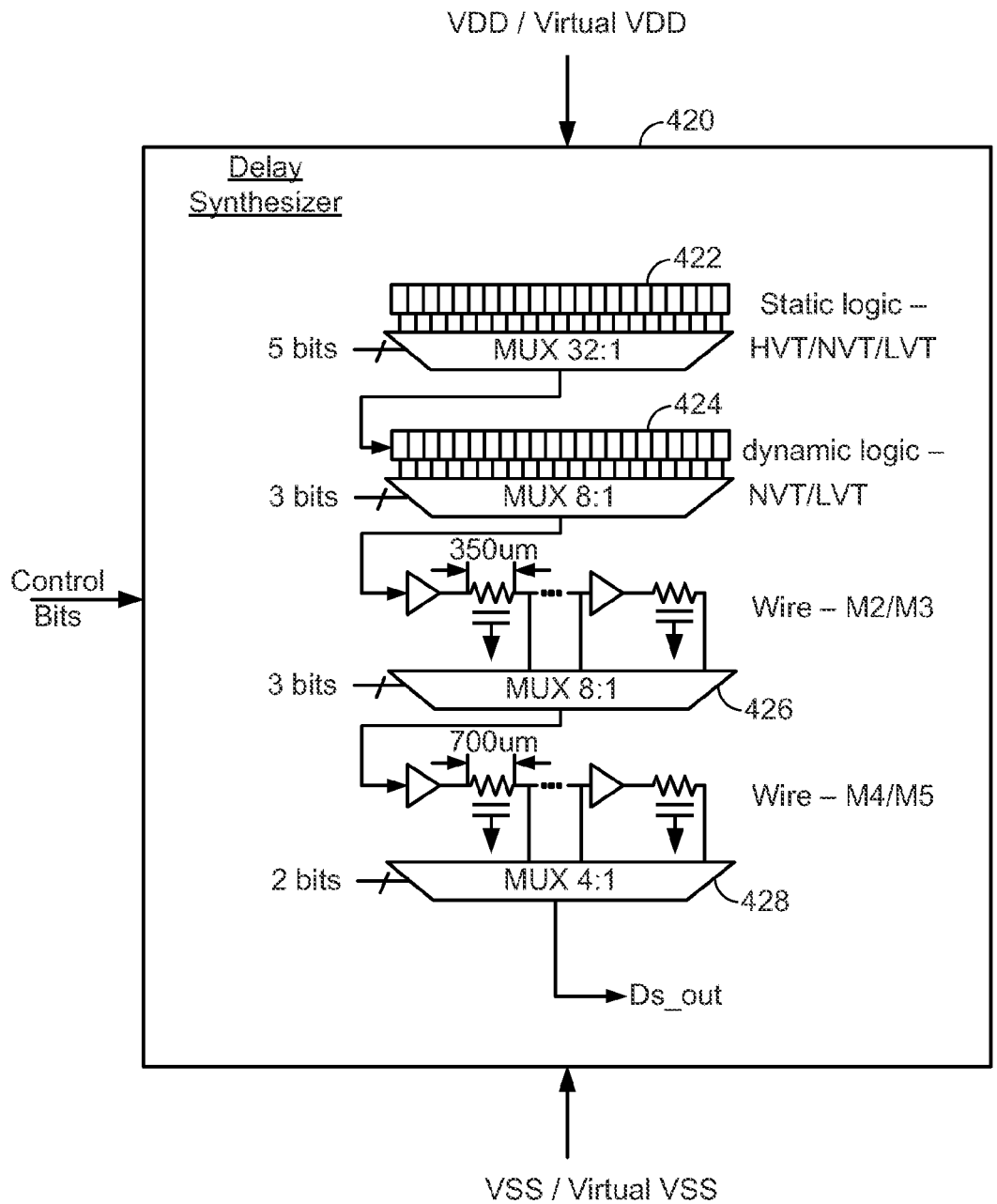
FIG. 5 illustrates details of a delay synthesizer FIG. 4.

FIG. 5 illustrates an embodiment of delay synthesizer 420. The elements of delay synthesizer 420 are supplied by the same virtual supply voltage (e.g., VDT) and Virtual Vss or Virtual VDD and VSS) as DUT 305, so that the voltage across both the actual and simulated paths is the same. The delay synthesizer 420 may contain a variety of elements that allow for flexible modeling of the DUT 305. For example, static logic 422 may contain an inverter chain having high threshold voltage (HVT) nominal threshold voltage (NVT) and low threshold voltage (LW) elements. Dynamic logic 424 may be considered to be a diffusion dominated path and may contain NVT/LVT elements. Additionally, multiple wire stages may be simulated. For example, a first wire stage 426 may simulate the wire delays in M2/M3 and another wire stage 428 may simulate wire delays in M4/M5. Control bits (e.g., from command unit 350) are supplied to delay synthesizer 420 to configure the various stages (422-428). Accordingly, the delay synthesizer 420 can be configured as a process monitor. Using different programmable bits setting, frequency/delay of front end path (gate dominated) and back end path (wire dominated) can be measured.

The delay synthesizer structure shown in FIG. 5 can flexibly replicate a critical path with a desired blend of circuit components. The critical path can be considered the signal path with the longest delay in the DUT. Each delay stage (422-428) can include multiple series-connected cells for a different type of circuit component. The multiplexer for each delay stage can include a selectable number of cells for that delay stage in the replicated critical path. The number of cells can be selected by the control bits from command unit 350 and may be based on a lookup table having bit settings for a given DUT 305. Accordingly, the same delay synthesizer 420 structure may be used to simulate a variety of circuits/devices under test. The settings can be individually and flexibly formed by controlling the multiplexers in the delay synthesizer 420 for a given DUT 305. In general, a delay synthesizer 420 structure may include any number of delay stage and each delay stage may emulate any type of circuit and may include any number of cells. Such a structure provides great flexibility in replicating a critical path of a device under test.

Referring back to FIG. 4, as discussed above, the monitor 330 generates voltage control signals based on the simulation of critical path of the device under test. The virtual voltage across the DUT is used to power at least the various elements of the delay synthesizer, which provides the feedback path for the voltage control. Since the monitor 330 is formed on the same die as the DUT and supplied by the same virtual supply voltage, similar process-voltage-temperature (PVT) characteristics will be seen by both the monitor 330 and the DUT 305. Accordingly, the monitor 330 can be used to match the various internal parameters of DUT 305 to provide an estimate of current conditions of the DUT 305 and provide control signals to adjust the controller 310. Additional details of an exemplary monitoring circuit including a delay synthesizer and matching MUX can be found in U.S. Pat. No. 7,417,482, issued on Aug. 26, 2008 entitled "ADAPTIVE VOLTAGE SCALING FOR AN ELECTRONICS DEVICE", which is incorporated herein by reference in its entirety.

Figure 6B:
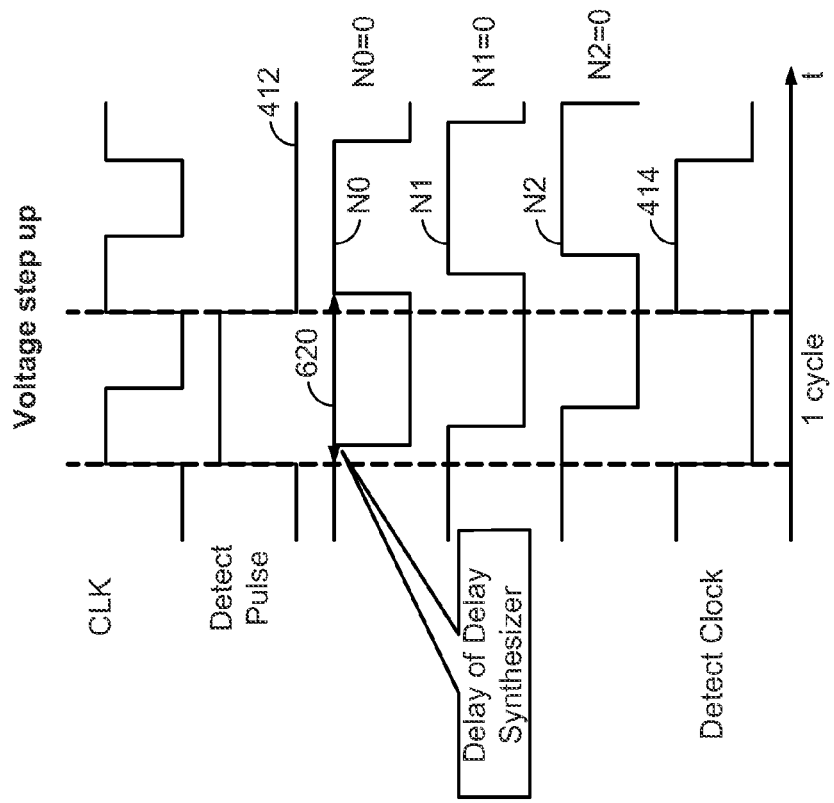
FIGS. 6A-6B illustrates timing diagrams at a decoder.
Figure 6A:
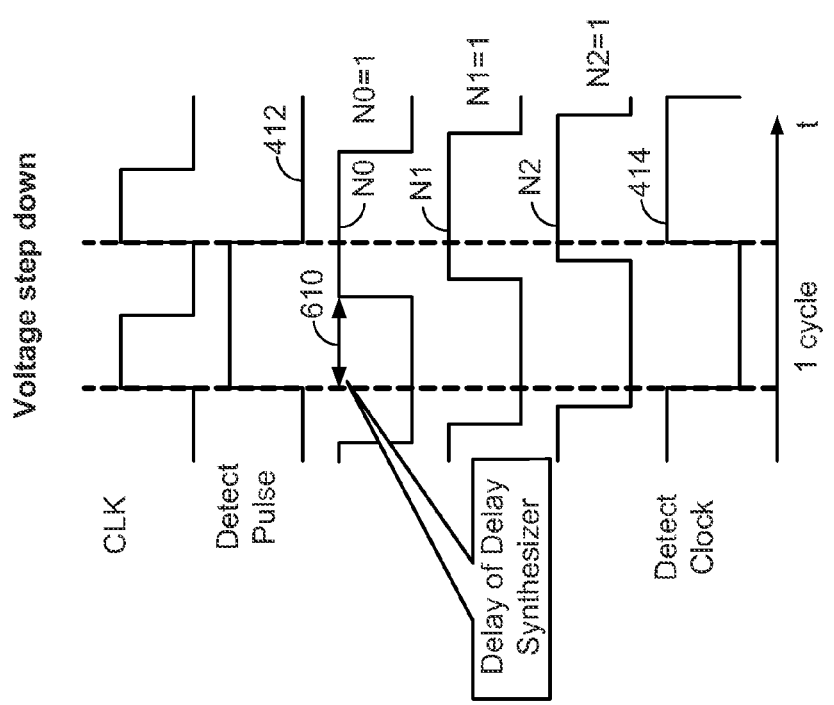

FIGS. 6A-6C illustrate aspects of the operation of an embodiment of the voltage comparator 440. For example, FIG. 6A illustrates a timing diagram for a voltage step down process. A clock signal (CLK) is illustrated at the top of FIG. 6. The rising edge of the clock signal triggers the detect pulse signal 412 (which is input into delay synthesizer 420). Delay synthesizer 420 causes a delay 610 in the detect pulse signal 412 being propagated from the pulse generator through the delay synthesizer 420 to delay comparator 440. The detect clock signal 414 occurs at the second rising edge of the clock signal CLK, at which point the values of N0, N1 and N2, are detected, N0, N1 and N2 are outputs of flip-flops 441, 443, 445 of delay comparator 440, respectively. In the illustrated example, the delay 610 causes each of the flip-flop outputs N0, N1 and N2 to be still in a high state when the detect clock signal 414 triggers, as can be seen FIG. 6A. In another example, illustrated in FIG. 6B, the delay 620 caused by delay synthesizer 420 causes flip-flop outputs N0, N1 and N2 to all be at a low state the when the detect clock signal 414 triggers.

FIG. 6C illustrates a state table for decoder 450 of delay comparator 440. Depending on the state of N0, N1 and N2, which are the inputs of delay comparator 440, the decoder 450 will activate the AVS_up output, the AVS_dn output or activate neither, which indicates that no adjustment to the controller 310 is needed. Specifically, as illustrated in FIG. 6C, when N0, N1 and N2 are all detected low, the decoder 450 activates the up output (AVS_up) to controller 310 to increase the voltage across DUT 305. When N0, N1 and N2 are all detected high, the decoder 450 activates the down output (AVS_dn) to controller 310 to decrease the voltage across DUT 305. In all other cases for inputs N0, N1 and N2 neither the up or down signals will be output. As can be seen from FIG. 4, buffers 442 and 444 create a one buffer delay in the output of flip-flop 443 and a two buffer delay in the output of flip-flop 445. Each of buffers 442 and 444 may be designed to provide a predetermined amount of delay, e.g., 5% of a clock period at the highest clock frequency. Each flip-flop 441, 443 and 445 provides a logic high if the pulse on its data input arrives earlier than the pulse on its clock input and provides a logic low otherwise. If the virtual supply voltage is too low, then the total delay of the replicated critical path by delay synthesizer 420 is long and all three flip-flops may provide logic lows. Conversely, if the virtual supply voltage is too high, then the total delay of the replicated critical path is smaller than the target frequency and all three flip-flops may provide logic highs. Accordingly, if the delay synthesizer 420 models the critical path of DUT 305 within a give number of delays elements, then it is determined that no adjustments are needed. However, if N0, N1 and N2 indicate that the difference is greater than two buffers, either leading or lagging, then the controller is either increased or decreased to ensure the virtual supply voltage is set appropriately. It will be appreciated that there could be a larger or smaller set of the delay elements in alternative configurations, which in turn sets the transition window. Further, in alternative implementations the delay elements can also be implemented as a vernier delay.

Figure 7A:
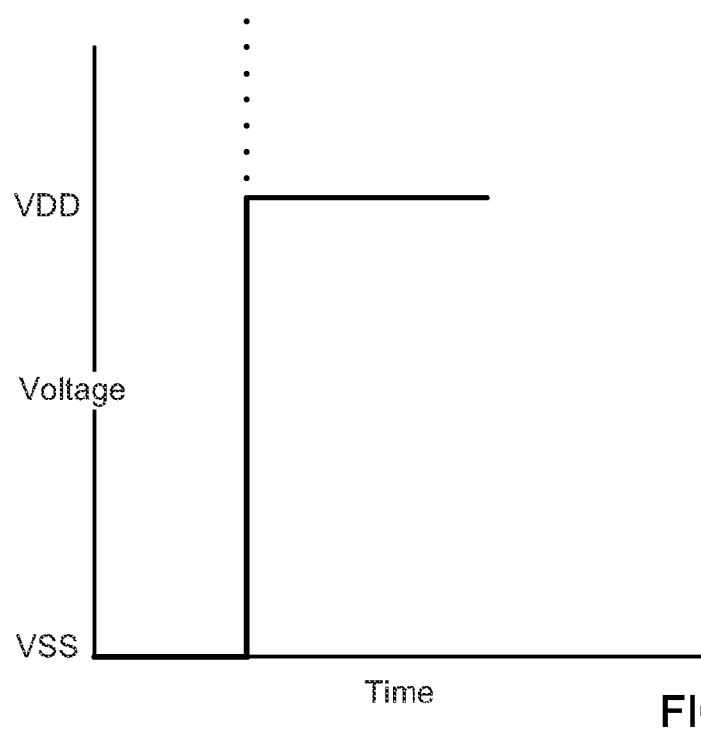
FIG. 7A illustrates the voltage across the conventional circuit of FIG. 1 during a transition from sleep mode to active mode.

In addition to regulating the voltage across DUT 305 based on the monitoring unit 330, discussed above, embodiments may also serve as a regulator to control rush current when transitioning from the various operating modes. In particular, when either a fully awake mode or sleep mode is set, a conventional system would merely switch on or off as illustrated in FIG. 7A. For example, the voltage across the conventional circuit 105 of FIG. 1 during a transition from sleep mode to fully awake mode is a direct switch between VSS and VDD. However, FIG. 7B illustrates the voltage across the circuit /DUT 305 of FIG. 3A during a transition from sleep mode to fully awake mode in accordance with one embodiment.

Figure 7B:
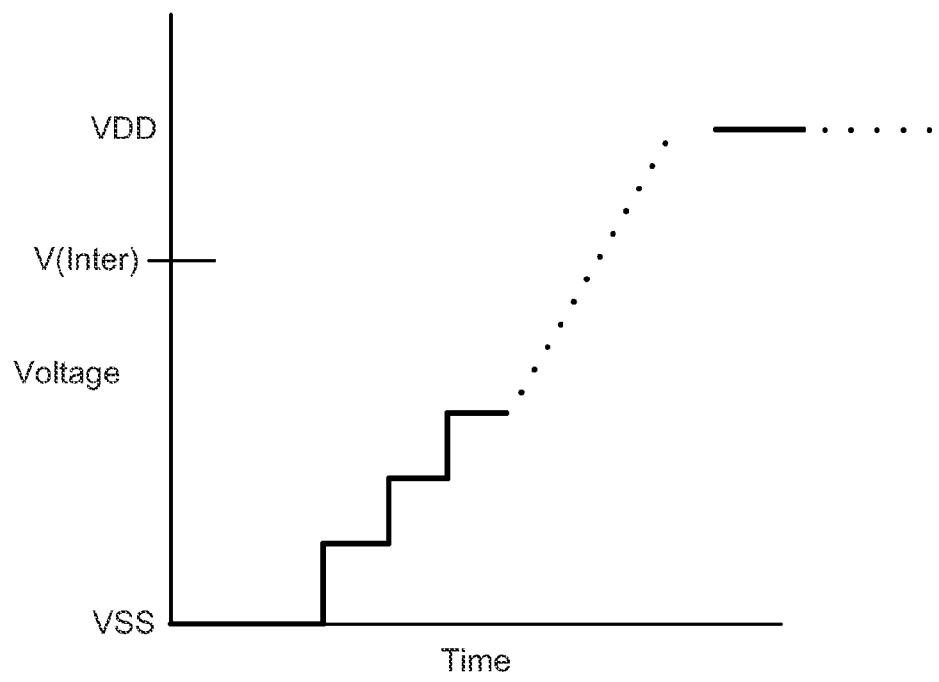
FIG. 7B illustrates the voltage across the circuit of FIG. 3A or 3B during a transition from sleep mode to active mode.

Referring to FIG. 7B, during a transition from sleep mode to active mode, the voltage across the DUT 305 may be transitioned in many incremental steps as illustrated based on the settings of the power switches as controlled by controller 310. When transitioning from sleep mode (all switches off) to fully awake (all switches on) or from an intermediate voltage (V(inter)) to sleep or fully awake, the rate of change can be controlled by the step size input and an internal loop frequency which controls how fast the switch to the next incremental step is made. For example, when transitioning from sleep mode to fully awake, the internal loop can ramp up the voltage until all power switches are active. However, because there can be multiple voltage steps (based on the step size input) this change in voltage will occur relatively smoothly and will mitigate the inrush current problems that are present in the conventional systems. It will be appreciated that when going from or to a boundary condition (sleep/fully awake) and maintaining the boundary condition, monitor 330 does not need to be used as the power switches are either fully on or off.

Figure 8:
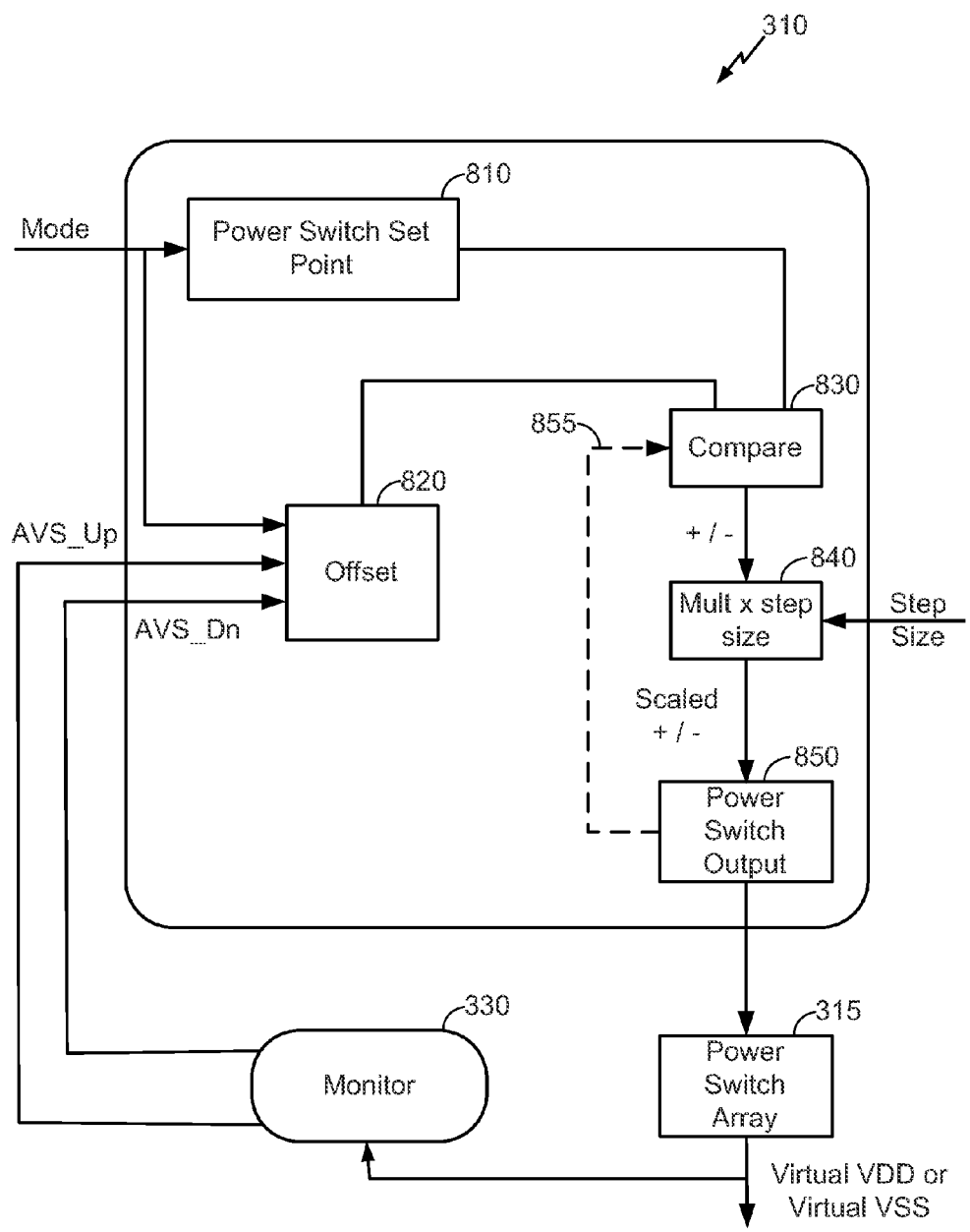
FIG. 8 illustrates detail of the controller of the control unit illustrated in FIGS. 3A and 3B.

FIG. 8 illustrates an embodiment of the controller 310. Upon the determination of a given operating point (which can include a control setting (control bits) to set the delay synthesizer, voltage (Mode) and clock frequency from command unit 350, which may included one or more lookup tables), the Mode signal is provided to power switch set point logic 810, which can convert the Mode signal (e.g., 2 or more bits) into a corresponding setting for the power switches (e.g., in volts, percent of full scale, etc.). The Mode signal is also provided to offset logic 820. This allows an override of the offset logic 820 to prevent oscillations when in either the sleep state (all power switches off) or the fully awake (all power switches on). The output of the power switch set point logic 810 is provided to compare logic 830, which compares it to the output of offset logic 820 and generates an output based on the comparison (e.g., either a increment up, increment down, or no action). The output of compare logic 830 is scaled by the Step Size in step scaling logic 840, which can set the incremental steps in terms voltage, percent of full scale, etc. For example, the Step Size may indicate that a 50 mV step is desired, so each incremental up or down, will be done at 50 mV intervals. The scaled output from step scaling logic 840 is provided to the power switch set logic 850. The power switch output logic 850 converts the scaled output from step scaling logic 840 in to an appropriate setting for the power switch array 315 and outputs that setting to adjust the controlled voltage (Vvss/Vvdd) appropriately. It will be appreciated that the power switch array may not respond in a linear fashion. Accordingly, power switch set logic 850 may include a lookup table, or other means to convert the commanded voltage (or percent of full scale) to a power switch setting. For example, if the scaled output from step scaling logic 840 is 50 mV, then power switch set logic 850 would convert the 50 mV command into an appropriate number of power switches to be turned on or off. If it is incremented again, then the power switch setting for 100 mV could be looked up and output to the power switch array 315. Accordingly, the controlled voltage (Vvss/Vvdd) will be incremented or decremented by the desired amount.

As illustrated in FIG. 8 (and also in FIGS. 3A and 313), the controlled voltage (Vvss/Vvdd) provides a feedback to the monitor circuit 330. The monitor 330 outputs an up signal, a down signal or neither an up or down signal (e.g., a do nothing signal), which are provided to the offset logic 820. The up/down signals will either increment or decrement the offset logic 820 until the feedback loop is satisfied and the controlled voltage level has achieved the desired level.

Alternatively, an internal feedback loop 855 may be provided between the power switch set logic and the compare logic 830. The internal feedback loop can be used to internally adjust the power switch set logic 850 until it reaches the value of the set point from 810. For example, if the output from 810 sets the reference to 1.0 V (1000 mV) and the step size is 50 mV then starting from 0 after 20 iterations (each scaled to 50 mV), the setting at the power switch set logic will equal the 1.0 V command from 810. In this configuration, the feedback from monitor circuit 330 to offset logic 820 can provide further fine tuning based on the results of the monitor circuit 330. For example, if the monitor circuit 330 determines the voltage needs to be increased, the AVS_Up signal can be activated and the offset logic 820 can output an offset that cause the compare logic 830 to increment the output (scaled by step scaling logic 840) to power switch set logic 850, thereby causing the controlled voltage to increase.

While above-described embodiments of the present invention have been directed to a footswitch and footswitch matrix implementation, it is understood that other embodiments of the present invention can be directed to a headswitch implementation (e.g., with or without accompanying footswitches). Likewise, while above-described embodiments of the present invention have been directed to a single-intermediate stage, it is understood that other embodiments of the present invention can use multiple intermediate stages (e.g., with different numbers of footswitches/headswitches turned on or off).

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

Figure 9:
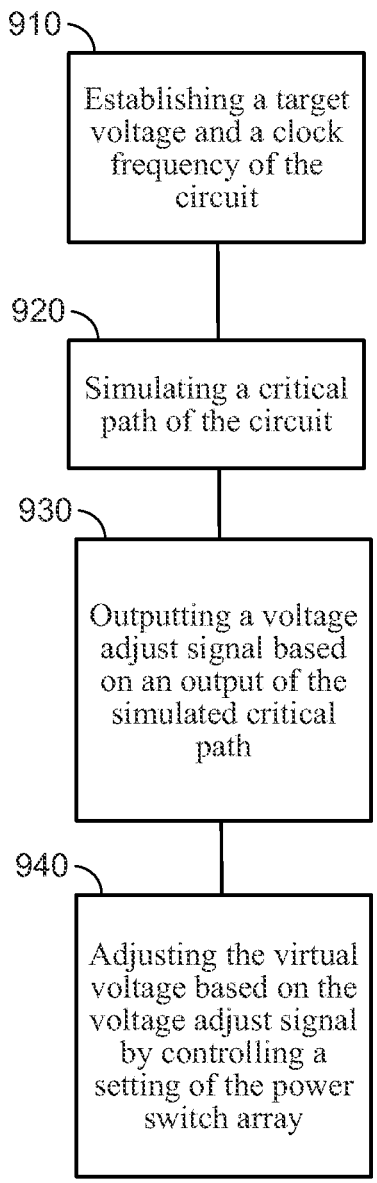
FIG. 9 illustrates a method of on-chip voltage regulation.

In view of the foregoing, it will be appreciated that embodiments can include methods, sequences and/or algorithms for performing the various functions described herein. Accordingly, as illustrated in FIG. 9, embodiments may include a method of controlling voltage in a semiconductor device having a circuit positioned between a ground bus and a power bus and a power switch array positioned between the circuit and one of the ground bus or the power bus to generate a virtual voltage across the circuit. The method includes establishing a target voltage and a clock frequency of the circuit, in block 910. A critical path of the circuit is simulated, in block 920. A voltage adjust signal is outputted based on an output of the simulated critical path; in block 930 The virtual voltage is then adjusted based on the voltage adjust signal by controlling a setting of the power switch array, in block 940.

Figure 10:
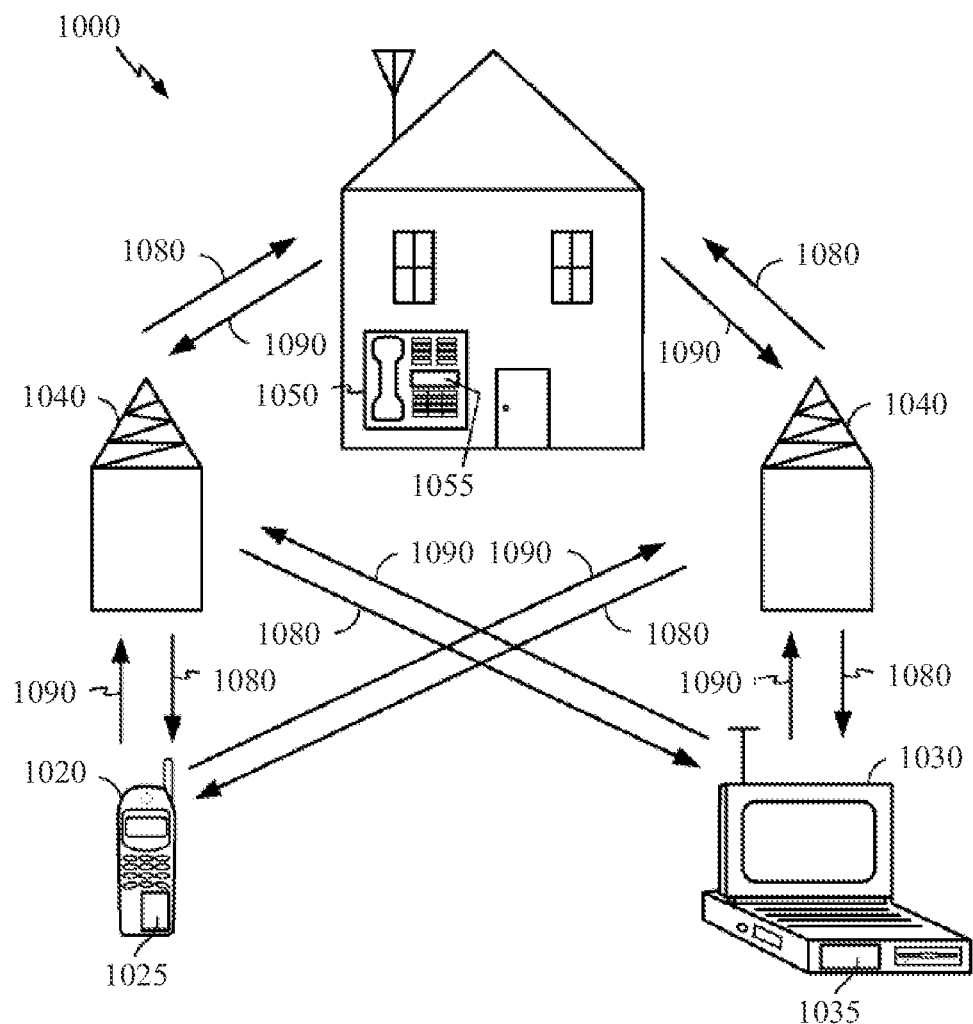
FIG. 10 illustrates a wireless communications network.

The various embodiments disclosed herein are not limited to those illustrated in FIG. 9 and embodiments may further include simulating a delay of the critical path by setting control bits in a delay synthesizer to generate a delay output and compensating for a delay of programmable multiplexers in the delay synthesizer to generate a compensation output. Then, embodiments can compare the delay output (e.g. Ds_out of FIG. 4) and the compensation output (e.g. Dm_out of FIG. 4) and generate the voltage adjust signal based on the comparing. The voltage adjust signal can include a two bit pattern for indicating an up signal, a down signal and a do nothing signal. The virtual voltage can be incrementally changed based on the up signal or the down signal (e.g. via, controller 310). Other embodiments can include methods for establishing the target voltage includes receiving a mode signal that includes one of a sleep mode, a fully awake mode or an intermediate mode and converting the mode signal to a set point for the power switch array. Still other embodiments include adjusting the virtual voltage by converting the target voltage into settings of individual switches in the power switch array and scaling an amount of change of the virtual voltage base on a step size signal, as discussed in the foregoing. It will be appreciated that many additional method embodiments are disclosed in connection with various illustrative examples and related descriptions disclosed herein FIG. 10 illustrates an exemplary wireless communication system 1000 in which one or more embodiments of the disclosure may be advantageously employed. For purposes of illustration, FIG. 10 shows three remote units 1020, 1030, and 1050 and two base stations 1040. It will be recognized that conventional wireless communication systems may have many more remote units and base stations. The remote units 1020, 1030, and 1050 include semiconductor devices 1025, 1035 and 1055 (including on-chip voltage regulators, as disclosed herein), which are among embodiments of the disclosure as discussed further below. FIG. 10 shows forward link signals 1080 from the base stations 1040 and the remote units 1020, 1030, and 1050 and reverse link signals 1090 from the remote units 1020, 1030, and 1050 to the base stations 1040.

In FIG. 10, the remote unit 1020 is shown as a mobile telephone, the remote unit 1030 is shown as a portable computer, and the remote unit 1050 is shown as a fixed location remote unit in a wireless local loop system. For example, the remote units may be mobile phones, hand-held personal communication systems (PCS) units, portable data units such as personal data assistants, navigation devices (such as GPS enabled devices), set top boxes, music players, video players, entertainment units, fixed location data units such as meter reading equipment, or any other device that stores or retrieves data or computer instructions, or any combination thereof. Although FIG. 10 illustrates remote units according to the teachings of the disclosure, the disclosure is not limited to these exemplary illustrated units. The disclosed device may be suitably employed in any device which includes a semiconductor device with an on-chip voltage regulator.

The foregoing disclosed devices and methods may be designed and configured into GDSII and GERBER computer files, stored on a computer readable media. These files are in turn provided to fabrication handlers who fabricate devices based on these files. The resulting products are semiconductor wafers that are then cut into semiconductor die and packaged into a semiconductor chip. The chips are then employed in devices described above. Accordingly, in some embodiments, the semiconductor device with an on-chip voltage regulator is integrated in at least one semiconductor die.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal (e.g., access terminal). In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A semiconductor device comprising:
    a circuit positioned between a ground bus and a power bus;
    a power switch array positioned between the circuit and one of the ground bus or the power bus to generate a virtual voltage across the circuit;
    a monitor positioned between the ground bus and the power bus, the monitor configured to measure a voltage across the circuit and output a voltage adjust signal based on feedback from the measured voltage across the circuit; and
    a controller configured to receive the voltage adjust signal and to output a control signal to the power switch array to control the virtual voltage,
    wherein the controller is further configured to receive a mode signal that indicates a target voltage and wherein the controller further comprises:
    compare logic configured to compare the target voltage to a voltage command signal and output a voltage difference signal; and
    power switch output logic configured to convert the voltage difference signal into the voltage command signal and to settings of individual switches in the power switch array.

2. The semiconductor device of claim 1, wherein the monitor further comprises:
    a delay synthesizer configured to simulate a critical path of the circuit.

3. The semiconductor device of claim 2, wherein the delay synthesizer is coupled to the virtual voltage.

4. The semiconductor device of claim 2, wherein the monitor further comprises:
    a matching MUX circuit configured to compensates for a delay of programmable multiplexers in the delay synthesizer.

5. The semiconductor device of claim 4, wherein the monitor further comprises:
    a delay comparator configured to compare an output of the delay synthesizer and an output of matching MUX circuit and generates the voltage adjust signal based on the comparison.

6. The semiconductor device of claim 1, wherein the voltage adjust signal includes an up signal, a down signal and a do nothing signal.

7. The semiconductor device of claim 1, wherein the power switch array is at least one of a footswitch array positioned between the circuit and the ground bus or a headswitch array positioned between the circuit and the power bus.

8. The semiconductor device of claim 1, wherein the semiconductor device is integrated in at least one semiconductor die.

9. The semiconductor device of claim 1, further comprising a device, selected from the group consisting of a set top box, music player, video player, entertainment unit, navigation device, communications device, personal digital assistant (PDA), fixed location data unit, and a computer, into which the semiconductor device is integrated.

10. The semiconductor device of claim 1, wherein the mode signal identifies at least one of a sleep mode; a fully awake mode or an intermediate mode.

11. The semiconductor device of claim 1, wherein the target voltage is used as set point for the power switch array.

12. The semiconductor device of claim 11, wherein the controller further comprises:
    power switch set point logic configured to convert the mode signal to the set point for the power switch array.

13. The semiconductor device of claim 1, wherein the controller further comprises:
    offset logic configured to receive the control signal from the controller and to generate an offset to the target voltage based on the control signal.

14. The semiconductor device of claim 1, wherein offset logic is further configured to receive the mode signal.

15. The semiconductor device of claim 14, wherein the offset logic is disabled if the mode signal indicates all power switches should be turned on or off.

16. The semiconductor device of claim 1, wherein the controller further comprises:
    step scaling logic configured to receive a step signal that indicates an amount of change of the voltage difference signal.

17. The semiconductor device of claim 1, wherein the controller further comprises:
    offset logic configured to receive the control signal from the controller and to generate an offset to the target voltage based on the control signal.

18. The semiconductor device of claim 17, wherein the compare logic is further configured to receive the offset and adjust the voltage difference signal based on the offset.

19. A method of controlling voltage in a semiconductor device having a circuit positioned between a ground bus and a power bus and a power switch array positioned between the circuit and one of the ground bus or the power bus to generate a virtual voltage across the circuit, comprising:
    establishing a target voltage based on a received mode signal that indicates the target voltage and establishing a clock frequency of the circuit;
    measuring a voltage across the circuit;
    outputting a voltage adjust signal based on feedback from the measured voltage across the circuit;
    adjusting the virtual voltage based on the voltage adjust signal by controlling a setting of the power switch array
    comparing the target voltage to a voltage command signal and outputting a voltage difference signal; and
    converting the voltage difference signal into the voltage command signal and to settings of individual switches in the power switch array.

20. The method of claim 19, further comprising, simulating a critical path of the circuit, wherein simulating the critical path comprises simulating a delay of the critical path by setting control bits in a delay synthesizer to generate a delay output.

21. The method of claim 20, further comprising:
    compensating for a delay of programmable multiplexers in the delay synthesizer to generate a compensation output.

22. The method of claim 21, further comprising:
comparing the delay output and the compensation output; and
generating the voltage adjust signal based on the comparing.

23. The method of claim 22, wherein generating the voltage adjust signal includes generating an up signal, a down signal and a do nothing signal.

24. The method of claim 23, further comprising:
incrementally changing the virtual voltage based on the up signal or the down signal.

25. The method claim 19, wherein establishing the target voltage includes receiving a mode signal including one of a sleep mode, a fully awake mode or an intermediate mode.

26. The method claim 25, further comprising:
converting the mode signal to a set point for the power switch array.

27. The method claim 19, wherein adjusting the virtual voltage further comprises:
scaling an amount of change of the virtual voltage base on a step size signal.

28. A method of controlling voltage in a semiconductor device having a circuit positioned between a ground bus and a power bus and a power switch array positioned between the circuit and one of the ground bus or the power bus to generate a virtual voltage across the circuit, comprising:
step for establishing a target voltage based on a received mode signal that indicates the target voltage and step for establishing a clock frequency of the circuit;
step for measuring a voltage across the circuit;
step for outputting a voltage adjust signal based on feedback from the measured voltage across the circuit;
step for adjusting the virtual voltage based on the voltage adjust signal by controlling a setting of the power switch array
step for comparing the target voltage to a voltage command signal and outputting a voltage difference signal; and
step for converting the voltage difference signal into the voltage command signal and to settings of individual switches in the power switch array.

29. The method of claim 28, further comprising, step for simulating a critical path of the circuit, wherein the step for simulating the critical path comprises simulating a delay of the critical path by setting control bits in a delay synthesizer to generate a delay output.

30. The method of claim 29, further comprising:
step for compensating for a delay of programmable multiplexers in the delay synthesizer to generate a compensation output.

31. The method of claim 30, further comprising:
step for comparing the delay output and the compensation output; and
step for generating the voltage adjust signal based on the comparing.

32. The method of claim 31, wherein the step for generating the voltage adjust signal includes generating an up signal, a down signal and a do nothing signal.

33. The method of claim 32, further comprising:
step for incrementally changing the virtual voltage based on the up signal or the down signal.

34. The method claim 28, wherein the step for establishing the target voltage includes receiving a mode signal including one of a sleep mode, a fully awake mode or an intermediate mode.

35. The method claim of 34, further comprising:
step for converting the mode signal to a set point for the power switch array.

36. The method claim 28, wherein the step for adjusting the virtual voltage further comprises:
step for scaling an amount of change of the virtual voltage base on a step size signal.

37. A semiconductor device having a circuit positioned between a ground bus and a power bus and a power switch array positioned between the circuit and one of the ground bus or the power bus to generate a virtual voltage across the circuit, comprising:
means for establishing a target voltage based on a received mode signal that indicates the target voltage and means for establishing a clock frequency of the circuit;
means measuring a voltage across the circuit;
means for outputting a voltage adjust signal based on feedback from the measured voltage across the circuit;
means for adjusting the virtual voltage based on the voltage adjust signal by controlling a setting of the power switch array
means for comparing the target voltage to a voltage command signal and outputting a voltage difference signal; and
means for converting the voltage difference signal into the voltage command signal and to settings of individual switches in the power switch array.

38. The semiconductor device of claim 37, further comprising, means for simulating a critical path of the circuit, wherein the means for simulating the critical path comprises means for simulating a delay of the critical path by setting control bits in a delay synthesizer to generate a delay output.

39. The semiconductor device of claim 38, further comprising:
means for compensating for a delay of programmable multiplexers in the delay synthesizer to generate a compensation output.

40. The semiconductor device of claim 39, further comprising:
means for comparing the delay output and the compensation output; and
means for generating the voltage adjust signal based on the comparing.

41. The semiconductor device of claim 40, wherein the means for generating the voltage adjust signal includes means for generating an up signal, a down signal and a do nothing signal.

42. The semiconductor device of claim 41, further comprising:
means for incrementally changing the virtual voltage based on the up signal or the down signal.

43. The semiconductor device claim 37, wherein the means for establishing the target voltage includes means for receiving a mode signal including one of a sleep mode, a fully awake mode or an intermediate mode.

44. The semiconductor device claim 43, further comprising:
means for converting the mode signal to a set point for the power switch array.

45. The semiconductor device claim 37, wherein the means for adjusting the virtual voltage further comprises:
means for scaling an amount of change of the virtual voltage base on a step size signal.

46. The semiconductor device of claim 37, wherein the semiconductor device is integrated in at least one semiconductor die.

47. The semiconductor device of claim 37, further comprising a device, selected from the group consisting of a set top box, music player, video player, entertainment unit, navigation device, communications device, personal digital assistant (PDA), fixed location data unit, and a computer, into which the semiconductor device is integrated.

48. The semiconductor device of claim 1, wherein the feedback is configured to indicate whether the measured voltage across the circuit is leading or lagging.

\* \* \* \* \*